United States Patent [19]
Takeda et al.

[11] Patent Number: 5,591,963
[45] Date of Patent: Jan. 7, 1997

[54] PHOTOELECTRIC CONVERSION DEVICE WITH DUAL INSULATING LAYER

[75] Inventors: Shinichi Takeda, Atusgi; Hidemasa Mizutani, Sagamihara; Noriyuki Kaifu, Hachioji; Isao Kobayashi, Atsugi, all of Japan

[73] Assignee: Canon Kabushiki Kaisha, Tokyo, Japan

[21] Appl. No.: 512,698

[22] Filed: Aug. 8, 1995

[30] Foreign Application Priority Data

Aug. 22, 1994 [JP] Japan .................................. 6-196646
Aug. 22, 1994 [JP] Japan .................................. 6-196647

[51] Int. Cl.$^6$ .................................................. H01J 40/14
[52] U.S. Cl. .............................. 250/214.1; 250/214 LS; 257/17
[58] Field of Search ........................... 250/214.1, 214 LS, 250/214 R, 214 SW; 257/440, 16, 17, 21, 53, 448, 459, 225, 290, 431

[56] References Cited

U.S. PATENT DOCUMENTS 4,863,245  9/1989  Roxlo ........................... 257/16
4,904,859  2/1990  Goossen et al. ............... 250/214 LS Primary Examiner—Que T. Le
Attorney, Agent, or Firm—Fitzpatrick, Cella, Harper & Scinto

[57] ABSTRACT

A photoelectric conversion device comprising, on a substrate, a photoelectric conversion element having in lamination, a first electrode layer, a first insulating layer for blocking carriers of first conduction type and second conduction type from passing therethrough, a photoelectric conversion semiconductor layer, a second insulating layer for blocking carriers of first conduction type and second conduction type from passing therethrough, and second electrode layers and a switch element having laminated a gate electrode layer, a third insulating layer, a semiconductor layer, an ohmic contact layer, a pair of first and second main electrode layers, and a wiring layer for electrically connecting first or second electrode layer of photoelectric conversion element to first main electrode layer of the switch element can be provided with high SN ratio and at lower cost without providing the injection blocking layer.

16 Claims, 11 Drawing Sheets

PHOTOELECTRIC CONVERSION DEVICE WITH DUAL INSULATING LAYER

BACKGROUND OF THE INVENTION

1. Field of the Invention

The present invention relates to a photoelectric conversion device, and more particularly to a photoelectric conversion device fabricated using a large area process, or a photoelectric conversion device which is suitably applied to a one-dimensional or two-dimensional photoelectric conversion system involving direct reading, such as a facsimile, a digital copy, or an X-ray image pick-up device.

2. Related Background Art

Conventionally, reading systems for the facsimile, digital copy, or X-ray image pick-up device have been known which employ a reduction optical system and a CCD type sensor. By the development of photoelectric conversion semiconductor materials represented by amorphous silicon hydride (hereinafter abbreviated as a-Si), they have been utilized as a so-called contact-type sensor which is formed with a photoelectric conversion unit and a signal processing unit on a large area substrate, and has an optical system for reading at direct magnification from an information source. In particular, a-Si can be used not only as photoelectric conversion material, but also as a field effect transistor (hereinafter denoted as "TFT"), and thus has the advantage of being able to form a photoelectric conversion semiconductor layer and the TFT as a switching element simultaneously.

FIGS. 1A to 1C are views for illustrating photosensors, FIG. 1A and FIG. 1B are typical cross-sectional views for illustrating the layer configuration of two kinds of photosensors, and FIG. 1C illustrates a typical drive method which is common to them. FIG. 1A and FIG. 1B are photosensors of different photo-diode types, referred to as a PIN-type and a Schottky type, respectively. In FIGS. 1A and 1B, 1 is an insulating substrate, 2 is a lower electrode layer, 3 is a p-type semiconductor layer (hereinafter denoted as a p-layer), 4 is an intrinsic semiconductor layer (hereinafter denoted as an i-layer), 5 is an n-type semiconductor layer (hereinafter denoted as an n-layer), and 6 is a transparent electrode layer. The Schottky type of FIG. 1B has a Schottky barrier layer formed to prevent injection of electrons from the lower electrode layer 2 into the i-layer 4 by suitably selecting the material of the lower electrode layer 2. In FIG. 1C, 10 is a symbolized photosensor, 11 is an electric power source, and 12 is a detecting unit such as an ammeter. The direction as indicated by C in the photosensor 10 is toward the side of transparent electrode layer 6, and the direction as indicated by A is toward the side of lower electrode layer 2, wherein the power source 11 is set such that a positive voltage with respect to the A side is applied to the C side.

Herein, the operation will be briefly described. As shown in FIGS. 1A and 1B, if a light is incident from the direction as indicated by the arrow upon the i-layer 4, the light is absorbed therein to produce electrons and holes. Because an electric field is applied to the i-layer 4 by the power source 11, electrons pass through the C side, or the n-layer 5, to the transparent electrode layer 5, while holes move to the A side, or the lower electrode layer 2. Hence, a photo-current will flow through the photosensor 10. Also, when there is no incident light, neither electrons nor holes are produced, and because for the holes within the transparent electrode layer 6, the n-layer 5 acts as a hole injection blocking layer, and for electrons within the lower electrode layer 2, the p-layer 3 of the PIN type of FIG. 1A, or a Schottky barrier layer of the Schottky type of FIG. 1B, acts as an electron injection blocking layer, both electrons and holes can not move, so that no current flows. Accordingly, the current changes depending on whether or not there is incident light, and if it is detected by the detecting unit 12, this photosensor is operable.

However, there were some difficulties to produce a photoelectric conversion device having high S/N ratio and lower cost with the photosensor of the above configuration.

SUMMARY OF THE INVENTION

It is an object of the present invention to provide a photoelectric conversion device, with an S/N ratio and a lower cost, which is capable of detecting the amount of incident light without providing an injection blocking layer, wherein the easy process optimization, the better yield and the reduced manufacturing cost can be effected.

Also, it is another object of the invention to provide a photoelectric conversion device, wherein electrode materials can be arbitrarily chosen without use of tunnel effect or a Schottky barrier between a first electrode layer or a second electrode layer to a photoelectric conversion semiconductor layer, with a high degree of freedom for the thickness of insulating layer or others, and good matching with other elements which must be formed at the same time, and particularly the same film configuration from a lower electrode layer which is a gate electrode to the semiconductor layer can be taken as that of a field effect transistor (TFT), so that each of the layers can be formed at the same time, and wherein a higher SN ratio and a lower cost can be effected.

Also, it is a further object of the invention to provide a photoelectric conversion device having composite functions with a simple configuration having the properties of storing light information as carriers in a photoelectric conversion unit itself, while at the same time flowing the current in real time.

It is another object of the invention to provide a photoelectric conversion device comprising a photoelectric conversion unit having laminated a first electrode layer, a first insulating layer for blocking carriers of first conduction type and carriers of second conduction type different from said first conduction type from passing therethrough, a photoelectric conversion semiconductor layer, a second insulating layer for blocking carriers of said first conduction type and carriers of said second conduction type from passing therethrough, and a second electrode layer, a power source unit for supplying, in a refresh mode, a potential between said first electrode layer and said second electrode layer, or making the same potential at said first electrode layer and said second electrode layer, to promote recombination of carriers of said first conduction type and carriers of said second conduction type within said photoelectric conversion semiconductor layer, or in a photoelectric conversion mode, supplying a potential between said first electrode layer and said second electrode layer to lead carriers of said first and second conduction types produced by the light incident upon said photoelectric conversion semiconductor layer to an interface between said second insulating layer and said photoelectric conversion semiconductor layer, and an interface between said first insulating layer and said photoelectric conversion semiconductor layer, respectively, and a detecting unit for detecting carriers of said second conduction type led to the interface between said first insulating layer and said photoelectric conversion semiconductor layer, or carriers of said first conduction type led to the interface between said second insulating layer and said photoelectric conversion semiconductor layer.

It is another object of the present invention to provide a photoelectric conversion device comprising:

a photoelectric conversion unit having laminated, on a substrate, a first electrode layer, a first insulating layer for blocking carriers of first conduction type and carriers of second conduction type different from said first conduction type from passing therethrough, a photoelectric conversion semiconductor layer, a second insulating layer for blocking carriers of said first conduction type and carriers of said second conduction type from passing therethrough, and a second electrode layer, a switch unit having laminated a gate electrode layer, a third insulating layer, a semiconductor layer, a pair of first and second main electrode layers separated by a portion which is a channel region of this semiconductor layer, and an ohmic contact layer between these main electrode layers and said semiconductor layer, wherein said first or second electrode layers of said photoelectric conversion unit and a first main electrode layer of said switch unit are electrically connected.

It is another object of the invention to provide a photoelectric conversion device comprising a first electrode layer, a first insulating layer provided on the first electrode layer for blocking carriers of first conduction type and carriers of second conduction type different from the first conduction type from passing therethrough, a photoelectric conversion semiconductor layer provided on the first insulating layer, a second insulating layer provided on the photoelectric conversion semiconductor layer for blocking carriers of the first conduction type and carriers of the second conduction type different from the first conduction type from passing therethrough, and a second electrode layer provided on the second insulating layer, wherein at least the second electrode layer and the photoelectric conversion semiconductor layer are of the same shape.

It is another object of the present invention to provide a photoelectric conversion device comprising a first electrode layer, a first insulating layer provided on the first electrode layer for blocking carriers of first conduction type and carriers of second conduction type different from the first conduction type from passing therethrough, a photoelectric conversion semiconductor layer provided on the first insulating layer, a second insulating layer provided on the photoelectric conversion semiconductor layer for blocking carriers of the first conduction type and carriers of the second conduction type different from the first conduction type from passing therethrough, and a second electrode layer provided on the second insulating layer for providing a potential with respect to the first electrode layer.

DETAILED DESCRIPTION OF THE PREFERRED EMBODIMENTS

First, we will describe the reason why there were difficult respects in producing a photosensor of the configuration as described above and shown in FIGS. 1A and 1B and having high S/N ratio and lower cost.

Figure 1A:
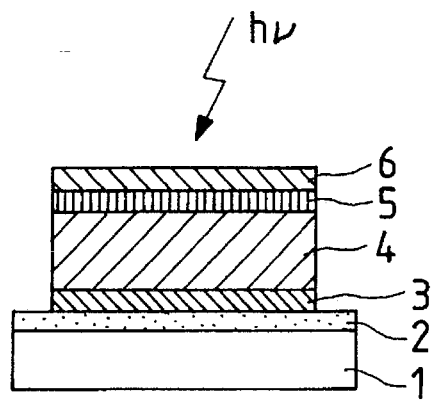
FIGS. 1A and 1B are typical cross-sectional views illustrating the configuration of photosensors.
Figure 1B:
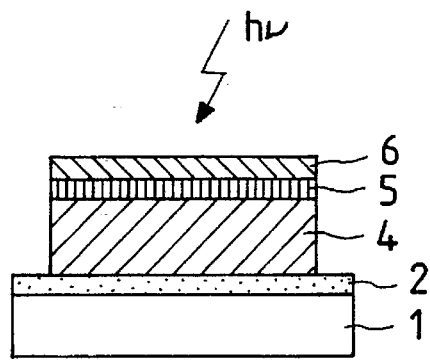

The first reason resides in that both the PIN type of FIG. 1A and the Schottky type of FIG. 1B need an injection blocking layer at two sites. In the PIN type of FIG. 1A, an n-layer 5 which is the injection blocking layer is required to have the characteristics of leading electrons to a transparent electrode layer 6, while at the same time blocking holes to an i-layer 4. If either of the characteristics is lacked, the light current will decrease, or the current when there is no incident illumination (hereinafter denoted as a dark current) is generated and increased, causing a decrease in the S/N ratio. This dark current as such is considered as the noise, and at the same time contains a fluctuation or a so-called quantize noise which is referred to as a shot noise, wherein even by subtracting this dark current in the detecting unit 12, the quantize noise component associated with the dark current can not be decreased. To enhance this characteristic, it is normally necessary to optimize the film formation conditions for the i-layer 4 or n-layer 5, or the annealing conditions after fabrication. However, for a p-layer 3 which is another injection blocking layer, the equivalent characteristics are required, although electrons and holes are reversed, and the optimization of each of the conditions is likewise necessary. Normally, the conditions of the former n-layer and those of the latter p-layer are not the same, and are difficult to satisfy optimally and simultaneously. Accordingly, the requirement of having the injection blocking layer at two sites within the same photosensor makes it difficult to form the photosensor having high SN ratio. This is the same with the Schottky type of FIG. 1B. Also, with the Schottky type of FIG. 1B, a Schottky barrier layer is used for one injection blocking layer, but this makes use of the difference in work function between a lower electrode layer 2 and the i-layer 4, whereby the material of the lower electrode layer 2 is limited, or the localized level at the interface has great effect on the characteristics, making it more difficult to satisfy the conditions. Also, to further enhance the characteristics of the Schottky barrier layer, it has been reported to form a silicon or metallic oxide film or nitride film as thin as about 100 Å between the lower electrode layer 2 and the i-layer 4, but this makes use of the tunnel effect to lead holes into the lower electrode layer 2 and blocks injection of electrons into the i-layer 4, more effectively, and also makes use of the difference in work function, so that the material of the lower electrode layer 2 is necessarily limited, and because of the opposite properties of blocking the injection of electrons and moving holes due to tunnel effect, the oxide film or nitride film must be made extremely thin, or more or less 100 Å, and the control of the thickness or film quality is difficult, resulting in lower productivity.

Also, the necessity of the injection blocking layer at two sites results in lower productivity and increased cost. This is because the injection blocking layer is of importance in the characteristics, and even if only one of two sites causes a failure owing to dirt, the characteristics as the photosensor can not be obtained.

Figure 1C:
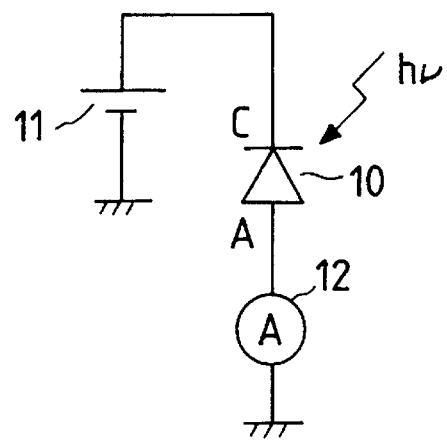
FIG. 1C is a schematic circuit diagram for exemplifying a driving method thereof.
Figure 2:
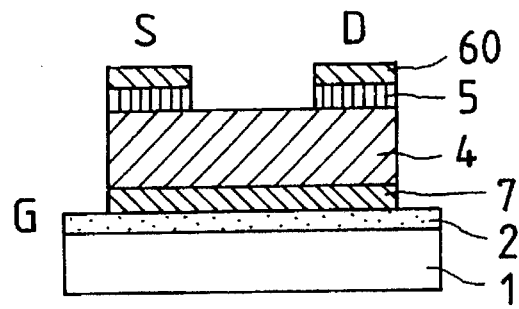
FIG. 2 is a typical cross-sectional view illustrating the configuration of a field effect transistor (thin film transistor).

The second reason is described using FIG. 2. FIG. 2 shows the layer configuration of a field effect transistor (thin film transistor or TFT) formed of thin film semiconductor layers. TFT is often used as a part of the control unit in forming a photoelectric conversion device. In the figure, like parts are indicated by like numerals in FIGS. 1A to 2. In FIG. 2, 7 is a gate insulating film, and 60 is an upper electrode layer. The forming method is described in sequence. On the insulating substrate 1, the lower electrode layer 2 which acts as a gate electrode (G), the gate insulating film 7, the i-layer 4, the n-layer 5, and the upper electrode layers 60 which act as the source and drain electrode (S, D) are sequentially formed, the upper electrode layers 60 are etched to form the source and drain electrodes, and then the n-layer 5 is etched to constitute a channel portion.

This TFT enables a switching operation of turning on or off between the source and drain electrodes consisting of the upper electrode layers 60 by controlling the voltage of the lower electrode layer 2 which acts as the gate electrode, but the characteristic of this TFT is significantly affected by the state of the interface between the gate insulating film 7 and the i-layer 4. For example, if there are a plenty of impurities on such interface, the threshold voltage of turning on or off the TFT is greatly deviated from the design value, the resistance value when the TFT is on significantly increases, and the resistance value when the TFT is off decreases, so that the operation characteristics of the TFT can not be obtained satisfactorily.

Also, even if the desired characteristics of TFT are initially obtained, the previously-mentioned threshold voltage is greatly changed, while the TFT repeats the on/off operation, possibly resulting in a problem of malfunction.

Normally, to obtain the good operation characteristics of TFT, that is, to form the excellent interface between the gate insulating film 7 and the i-layer 4, it is preferable that the gate insulating film 7 and the i-layer 4 of this TFT is continuously formed within the same vacuum.

However, when the photosensor with the above-described configuration is formed on the same substrate as this TFT, this layer configuration may cause a problem, resulting in an increase in the cost or a decrease in the characteristic. This reason is due to the fact that the configuration from the lower electrode layer to the i-layer of the photosensor as shown in FIGS. 1A to 1C is electrode layer/p-layer/ i-layer for the PIN type of FIG. 1A, or electrode layer/i-layer for the Schottky type of FIG. 1B, as opposed to electrode layer/insulating layer/i-layer for the TFT. Accordingly, to form a TFT in which the i-layer of the photosensor is commonly used, it is necessary that the gate insulating film 7 is formed on the lower electrode layer 2 of TFT, and then the i-layer 4 is formed. However, it is impossible to form continuously each layer of the photosensor and TFT within the same vacuum. This dictates that the process of forming each element of the photosensor and TFT must proceed in sequence for each element, and consequently, the complex process gives rise to a decrease in the yield and an increase in the cost.

Also, to make the i-layer and the n-layer common, an etching process for the gate insulating layer 7 or the p-layer 3 is necessary, in which the p-layer 3 and the i-layer 4 which are injection blocking layers or important layers of the photosensor as previously described may not be formed within the same vacuum, or due to contamination due to etching of the gate insulating layer at the interface between the gate insulating film 7 and the i-layer 4 which are important for the TFT, the characteristics or SN ratio is degraded.

Figure 3:
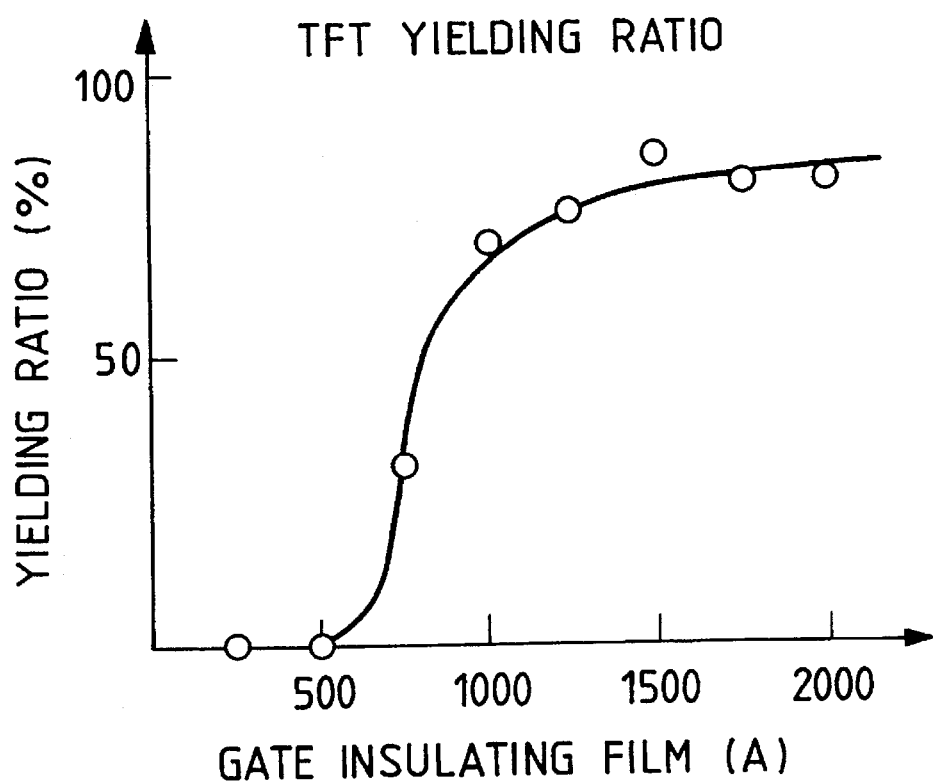
FIG. 3 is a graph representing the relation between the thickness and the yielding ratio of a gate insulating film for the thin film transistor.

Also, to improve the characteristics of the Schottky type as previously described and shown in FIG. 1B, the type having an oxide film or nitride film formed between the lower electrode layer 2 and the i-layer 4 can be made in the same film formation sequence. But as previously described, the oxide film or nitride film is necessary to be as thin as 100 Å, in which the film thickness is too thin to share it with the gate insulating film, and obtain the characteristics of both the photosensor and TFT. In FIG. 3, the results of experiment which we conducted are shown about the thickness of the gate insulating film and the yield of TFT. The yield rapidly decreases, if the thickness of the gate insulating film is below 1000 Å, the yield is about 30% at 800 Å, and 0% at 500 Å, and the TFT operation was not ascertained at 250 Å. This reveals that the gate insulating film of TFT in which the oxide film or nitride film of the photosensor making use of the tunnel effect must be insulated from electrons and holes is difficult to share.

In this way, the poor matching with the TFT which is an important element to create the photoelectric conversion device in terms of the process or characteristics causes the problem in constructing the overall system, as well as producing a high performance and multi-functional device at lower cost.

The present invention has been achieved to resolve these problems, and to provide a photoelectric conversion device capable of detecting the amount of incident light without providing an injection blocking layer within the photoelectric conversion device, and with high SN ratio and lower cost.

Also, there is provided a photoelectric conversion device wherein the photoelectric conversion device and a switch element such as TFT can be formed on the same substrate through the simple process, simultaneously, with a higher degree of freedom in design, and at reduced cost due to the simplified process, so as to be extendable to the applied products having multi-functions.

Namely, a first electrode layer, a first insulating layer, a photoelectric conversion semiconductor layer, and a second electrode layer for the photoelectric conversion element, and a gate electrode layer, a third insulating layer, a semiconductor layer, and main electrodes for the switching element, can be made of common films through the same process on the same substrate, with the film configuration which is important in the characteristics being made within the same vacuum, so as to be extendable to applied products of high performance having multi functions at lower cost, owing to higher degree of freedom in design and the simplified process.

It should be noted that by providing a third electrode layer of capacitive element, an intermediate layer having a fourth insulating layer, and a fourth electrode layer on the same substrate, it is possible to provide a photoelectric conversion device having a high function of outputting the integral value of light quantity incident upon the photoelectric conversion element, in addition to the above actions, all integrated on the same substrate.

The examples of the present invention will be described below in detail with reference to the drawings.

EXAMPLE 1

Figure 4A:
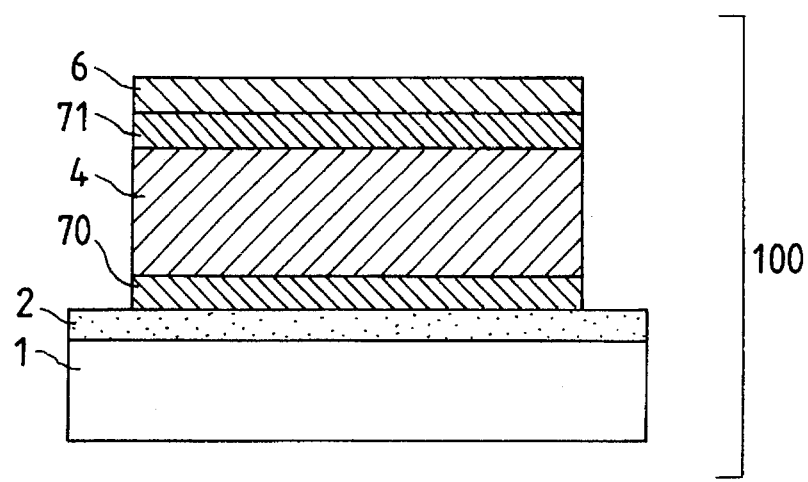
FIG. 4A and FIG. 10 are typical cross-sectional views illustrating a preferred example of a photoelectric conversion unit of a photoelectric conversion device according to the present invention.
Figure 4B:
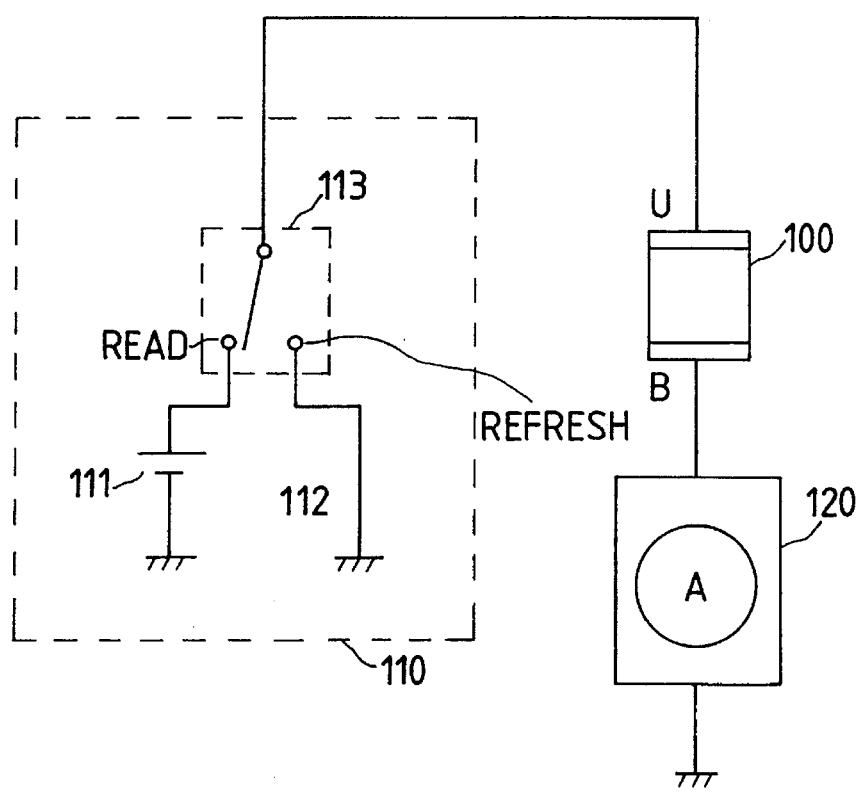
FIG. 4B and FIG. 9 are schematic circuit diagrams of one preferred example of the photoelectric conversion unit.

FIG. 4A and FIG. 4B are a typical layer configurational view and a schematic overall circuit diagram of a photoelectric conversion unit of a photoelectric conversion device according to a first example of the present invention. Like numerals are attached to corresponding parts in these figures and FIGS. 1A to 1C. In FIG. 4A, 1 is an insulating substrate made of glass, and 2 is a lower electrode layer formed of Al or Cr. 70 and 71 are lower and upper insulating layers formed of an insulating material such as silicon nitride (SiN) for blocking the passage of electrons and holes, its thickness being set to 500 Å or greater through which electrons and holes can not move due to tunnel effect. 4 is a photoelectric conversion semiconductor layer such as an i-layer made of a-Si, and 6 is a transparent electrode layer formed of ITO. In FIG. 4B, 100 is a symbol of photoelectric conversion unit as shown in FIG. 4A, U indicating an electrode on the side of transparent electrode layer 6 which is an upper electrode layer, and B indicating an electrode on the side of lower electrode layer 2. 120 is a detecting unit, and 110 is a power supply unit, which is composed of a positive power supply 111 for supplying a positive potential to U electrode, a connection 112 for supplying a GND potential which is the same potential as B electrode, and a switch 113 for switching between them. The switch 113 is controlled to connect to the refresh side in a refresh mode, or to the read side in a photoelectric conversion mode. Note that in an example as shown in FIG. 4A, at least the upper electrode layer 6 and the photoelectric conversion semiconductor layer 4 are of the same shape (or the substantial same shape) in plan view. The operation will be described below with reference to FIGS. 4A, 4B and FIGS. 5A to 5C.

Figure 5A:
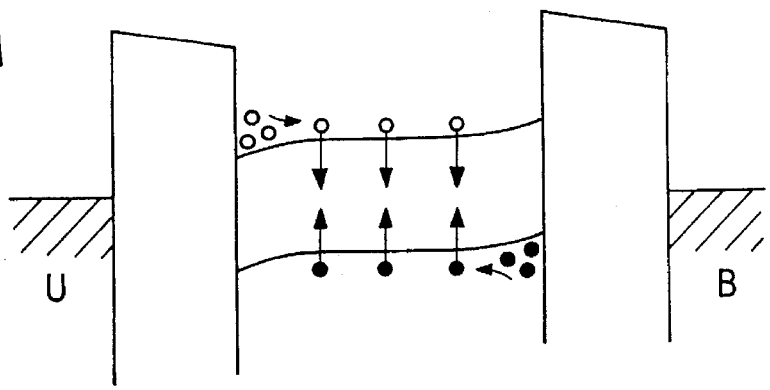
FIGS. 5A to 5C and FIGS. 7A and 7B are typical energy band diagrams, respectively.
Figure 5B:
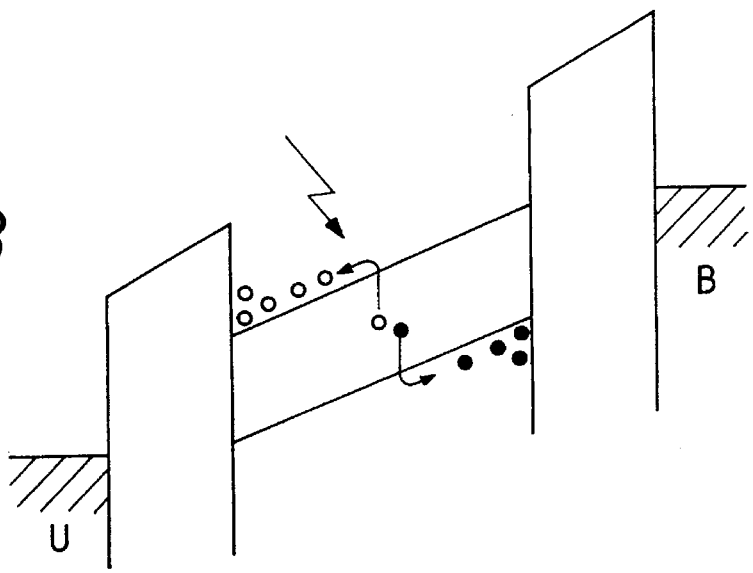

FIG. 5A and FIG. 5B are typical energy band diagrams of photoelectric conversion unit for explaining the operation in the refresh mode and the photoelectric conversion mode in respective examples, representing the state of each layer in thickness direction from the lower electrode layer 2 to the upper electrode layer 6 as shown in FIG. 4A. In FIG. 5A showing the refresh mode, U electrode is supplied with GND potential which is the same potential as B electrode. Thereby, holes indicated by black circle which exist on the interface between the i-layer 4 and the lower insulating layer 70 are distributed all over the i-layer 4 due to diffusion. Simultaneously, electrons indicated by white circle which exist on the interface between the i-layer 4 and the upper insulating layer 71 are also distributed all over the i-layer 4. In this state, holes and electrons recombine in the i-layer 4, and if this state continues over a sufficiently long time, holes and electrons within the i-layer 4 disappear, so that a slight amount of electrons and holes excited by heat only remain within the i-layer 4. In this state, turning to FIG. 5B of the photoelectric conversion mode, since U electrode is supplied with a positive potential with respect to B electrode, a slight amount of electrons and holes in the i-layer 4 are instantly led to the U electrode side and the B electrode side, to reach the interface between the i-layer 4 and the upper insulating layer 71, and the interface between the i-layer 4 and the lower insulating layer 70. However, since electrons and holes residing on each of the U electrode and the B electrode can not pass through the upper insulating layer 71 and the lower insulating layer 70, respectively, they are never led to the i-layer 4. In this state, if a light is incident upon the i-layer 4, the light is absorbed to produce electron-hole pairs. The electrons travel through the i-layer 4 owing to an electric field, led to the interface with the upper insulating layer 71, and likewise, the holes travel through the i-layer 4 to reach the interface between the i-layer 4 and the lower insulating layer 70. However, they can not move into the lower insulating layer 70, and will remain at the interface between the i-layer 4 and the lower insulating layer 70. Also, electrons, likewise, can not travel into the upper insulating layer 71, and will remain at the interface between the i-layer 4 and the lower insulating layer 71. Since the electrical neutrality within the element is held, a current flows from B electrode to the detecting unit 120. Since this current corresponds to electron-hole pairs produced by light, it is proportional to the quantity of incident light. After retaining the photoelectric conversion mode of FIG. 5B for a certain period of time, in the refresh mode of FIG. 5A again, electrons and holes remaining within the i-layer 4 are distributed into the i-layer 4, and at the same time a current corresponding to electrons and holes flows through the detecting unit 120, as previously described. The quantity of such holes corresponds to the total amount of light being incident during the period of photoelectric conversion mode, so that a current flowing through the detecting unit 120 corresponds to the total amount of light. That is, the photoelectric conversion unit 100 in this example outputs the amount of incident light in real time, while at the same time also outputting the total amount of light being incident for a certain period. This can be said to be a significantly superior respect of this example. The detecting unit 120 can detect either or both of them in accordance with the purpose.

Figure 5C:
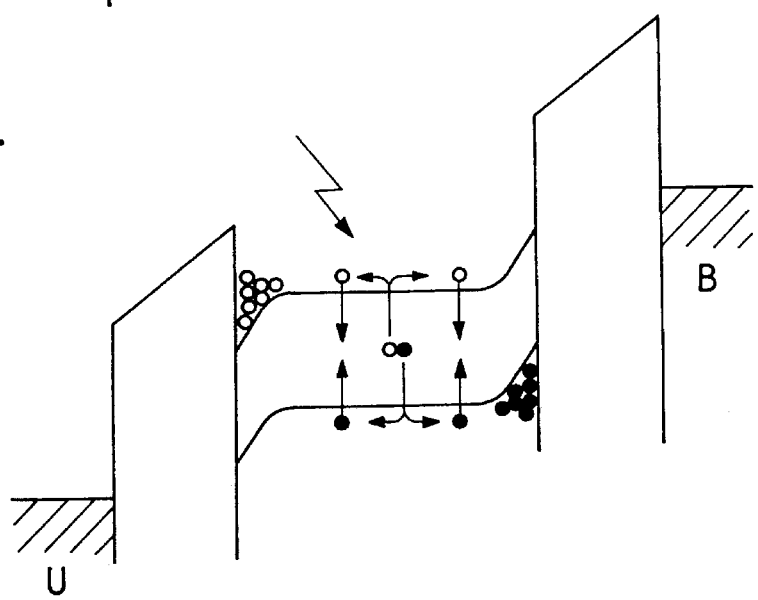
Figure 6:
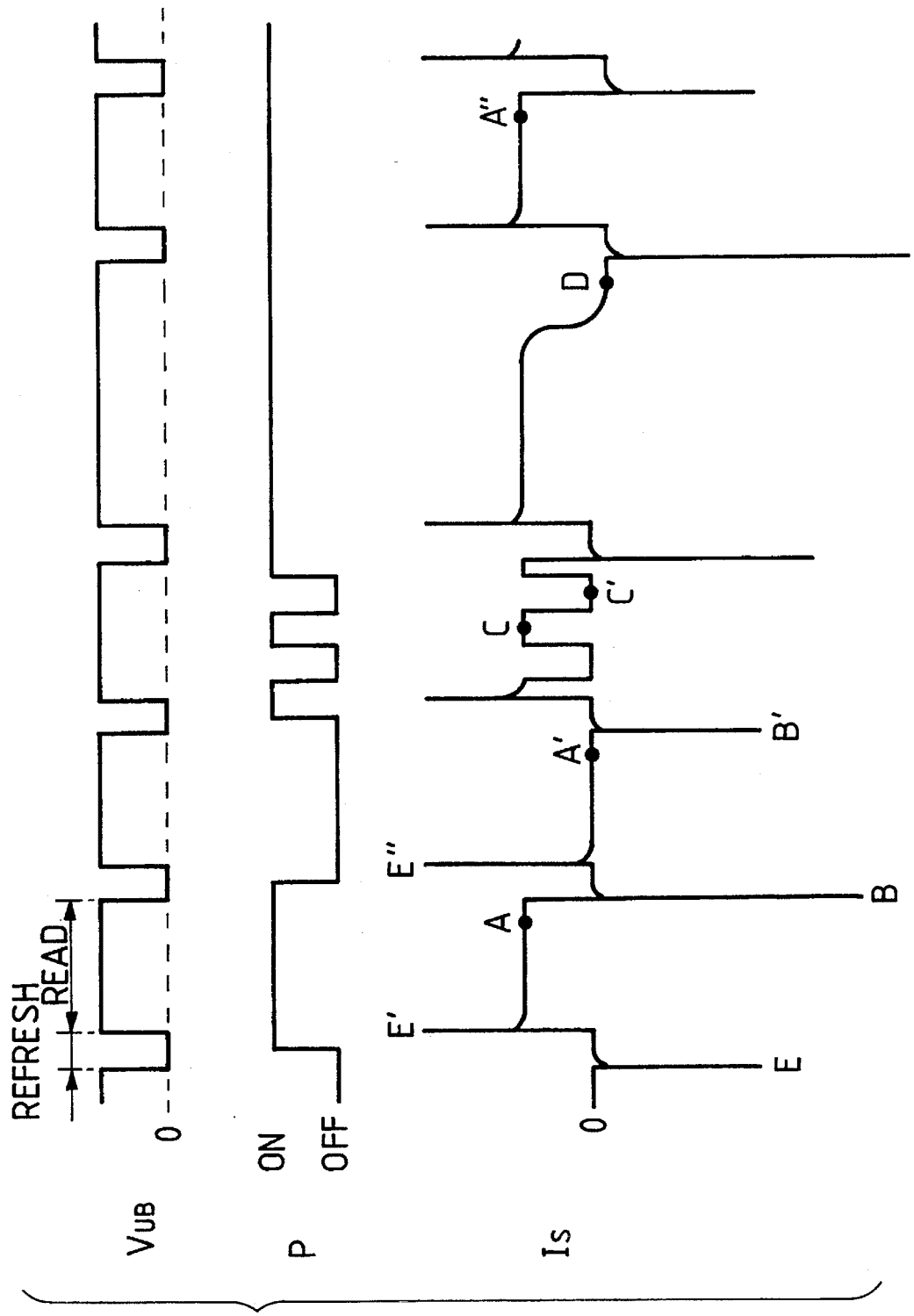
FIG. 6 is a preferred timing chart for explaining the driving of the photoelectric conversion device of the present invention.

Herein, the operation of the detecting unit 120 in this example will be described using FIGS. 4A, 4B, 5A to 5C and 6. FIG. 6 is a timing chart of operation in the photoelectric conversion device of FIGS. 4A and 4B. In the figure, $V_{UB}$ is a potential at the U electrode with respect to the B electrode of the photoelectric conversion unit 100, and P shows the state of light incidence, ON indicating the light incident state, and OFF indicating no incident illumination or dark state. $I_s$ shows the current flowing into the detecting unit 120, indicating the elapse of time in a transversal direction. At first, if a switch 113 is connected to the refresh side, the refresh mode is entered, $V_{UB}$ becomes 0V which is a GND potential, electrons and holes diffuse within the i-layer 4, and at the same time recombine, as shown in FIG. 5A, so that a negative rush current as indicated E in FIG. 6 flows through the detecting unit 120 as electric charges move. Thereafter, the refresh mode is ended, and if the switch 113 is connected to the read side, a positive rush current E' charging the equivalent capacity within the photoelectric conversion unit flows to enter the photoelectric conversion mode. At this time, if a light is incident, a light current indicated by A flows. If the similar operation is in the dark state, no current indicated by A' flows. Hence, if the light current A is integrated directly or over a certain period of time, the incidence of light can be detected. Also, if the switch 113 is connected to the refresh side from the A state, a rush current B flows. This is reflected to the total amount of incident light in a certain period of photoelectric conversion mode immediately before, and by integrating or equivalently evaluating this rush current B, the incidence of light can be detected. If there is no incident illumination in the photoelectric conversion mode immediately before, the rush current is reduced as indicated by B', and the detection of its difference will allow for detection of incident light. Also, since the rush current E or E' is almost equal to the rush current B', this may be subtracted from the rush current B.

Also, even in the same period of photoelectric conversion mode, if the state of light incidence changes, $I_s$ will change as indicated by C, C'. By detecting this change, the light incident state can be also detected. That is, it is indicated that the refresh mode is not necessarily enabled every time of detection.

However, for some reasons, in the cases where the period of photoelectric conversion mode is extended, or the illuminance of incident light is too intense, no current may flow, in spite of the incident illumination as indicated by D. This is because a great number of electrons and holes remain within the i-layer 4, and the electric field within the i-layer 4 is reduced, owing to such electrons and holes, so that produced electrons are not led to the interface between the i-layer 4 and the upper insulating layer 71, and recombine with holes within the i-layer 4, as shown in FIG. 5C. In this state, if the state of light incidence is changed, current may flow unstably, but by turning back to the refresh mode, electrons and holes within the i-layer 4 will extinguish, and then in the photoelectric conversion mode, current A' corresponding to incident light can be obtained, as in the photoelectric conversion mode. This is also one of the superior points.

In the above description, the incident light was constant, but the currents of A, B, and C all may change continuously, in accordance with the intensity of incident light, in which it is needless to say that not only the detection of whether or not there is incident illumination, but also the quantitative detection of intensity can be made.

Also, in the above description, in extinguishing electrons and holes within the i-layer 4 in the refresh mode, it is ideal that all electrons and holes disappear, but extinguishing electrons and holes only partly can take effect. Considering A or C which is light current, irrespective of whether electrons and holes are all or partly extinguished, the value is not changed, without causing any problem. Also, if electrons and holes are extinguished with a fixed amount of electrons and holes left, the light quantity can be also quantitatively detected by the current occurring at timing in B. That is, at the time of detection in the photoelectric conversion mode, it is necessary that the current value is not in the state D, i.e., the state as shown in FIG. 5C. That is, if its condition is met, it is only necessary that the voltage $V_{UB}$ in the refresh mode, and the period of refresh mode, may be appropriately determined. Also, it should be noted that in the refresh mode, the voltage $V_{UB}$ is not limited to OV. When a number of electrons and holes remain in the i-layer 4, the electric field within the i-layer is applied in a direction of leading holes to the U electrode side or electrons to the B electrode side, even if the $V_{UB}$ is at positive voltage, so that electrons and holes are distributed into the i-layer 4, and can be extinguished. Also, by appropriately setting $V_{UB}$ at a negative voltage, the electric field is applied in a direction of promoting distribution of electrons and holes into the i-layer 4, so that the higher extinction rate of electrons and holes can be attained.

Figure 7A:
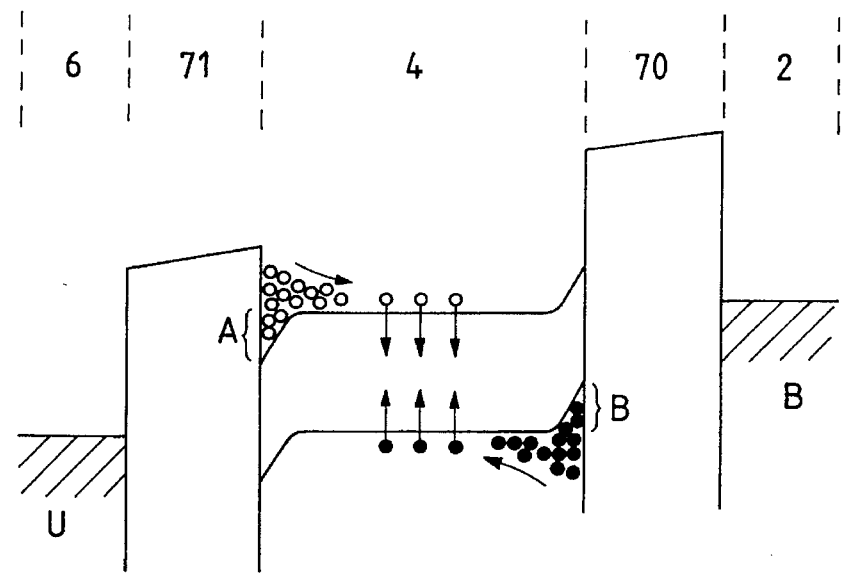
Figure 7B:
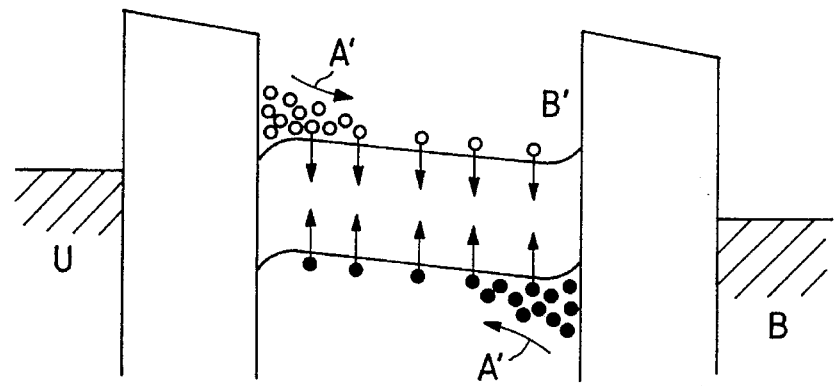

FIGS. 7A and 7B are typical energy band diagrams of photoelectric conversion unit showing the operation when the voltage $V_{UB}$ in the refresh mode is positive and negative, respectively, which diagrams are the same as FIG. 5A, except for the relation of potentials applied to the U electrode and the B electrode.

As shown in FIG. 5C, a great number of electrons and holes remain within the i-layer 4 in the photoelectric conversion mode, generating a small electric field within the i-layer 4, so that no current flows, irrespective of the incident illumination, and the voltage $V_{UB}$ is reduced below that in the photoelectric conversion mode, as shown in FIG. 7A. That is, in the refresh mode when the voltage $V_{UB}$ is positive, electrons and holes within the i-layer 4 remaining at the respective interfaces will move to the central side of the i-layer 4, except for electrons in A portion and holes in B portion, as shown in FIG. 7A, even if the voltage $V_{UB}$ does not become OV. Further, near the central portion of the i-layer 4, electrons and holes recombine, and if this state continues for a sufficiently long time, electrons and holes within the i-layer 4 disappear by recombination, except for electrons in A portion and holes in B portion. In this state, if the voltage $V_{UB}$ is increased, that is, the photoelectric conversion mode as shown in FIG. 5B is entered, it is clear that the light current in accordance with the quantity of incident light can be detected. In this case, in both the refresh mode and the photoelectric conversion mode, electrons always remain in A portion as shown in FIG. 7A which is the interface between the upper insulating layer 71 on the U electrode side and the i-layer 4, or similarly, holes always remain in B portion as shown in FIG. 7B which is the interface between the lower insulating layer 70 on the B electrode side and the i-layer 4. This takes effect in realizing a photoelectric conversion device having fast light response, without having adverse influence due to a state change at the interface level which causes a slow transient response in switching between the refresh mode and the photoelectric conversion mode.

Also, in the refresh mode as shown in FIG. 7B, if a voltage is applied to make the voltage $V_{UB}$ negative, an electric field is applied to the i-layer 4, so that the electrons and holes respectively move in a direction as indicated by the arrow A' in FIG. 7B, and electrons and holes are more rapidly distributed over the i-layer 4 to cause electrons and holes to recombine in the i-layer 4 (B' in FIG. 7B), and extinguish. In this case, since the movement of electrons and holes within the i-layer 4 is positively effected by the electric field, as well as the thermal diffusion, they can move faster, and disappear more rapidly, thereby taking effect in shortening the time of the refresh mode.

Figure 8A:
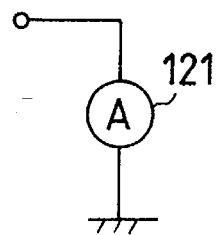
FIGS. 8A to 8D are schematic circuit diagrams for explaining one example of a detecting unit to which the present invention is applicable.
Figure 8B:
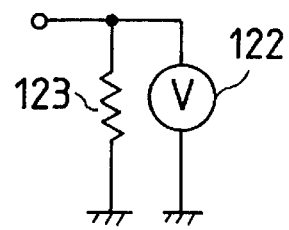
Figure 8C:
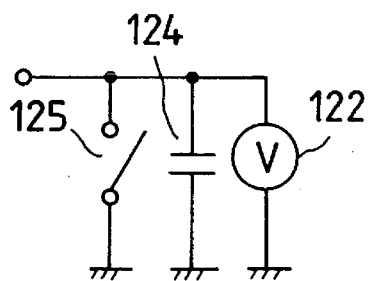
Figure 8D:
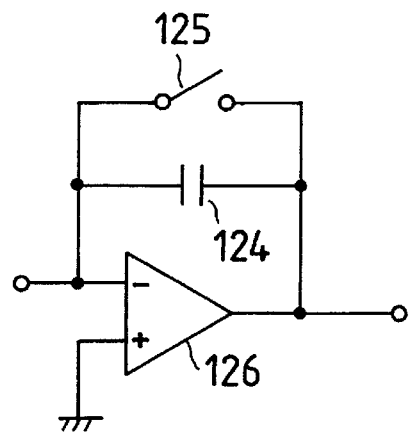

FIGS. 8A to 8D exemplify the configuration of detecting unit. 121 is an ammeter represented by current Amp, 122 is a voltmeter, 123 is an ohmmeter, 124 is a condenser, 125 is a switching element, and 126 is an operational amplifier. FIG. 8A shows a circuit for directly detecting the current, with the output of the ammeter 121 being a voltage or amplified current. FIG. 8B shows a circuit for detecting the voltage with the voltmeter 122 by passing a current through the resistor 123. FIG. 8C shows a circuit for storing electric charges in the condenser 124 and detecting its voltage with the voltmeter 122. FIG. 8D shows a circuit for detecting the integral value of current as the voltage by means of the operational amplifier 126. In FIGS. 8C and 8D, the switch element 125 plays a role of supplying an initial value for every detection, and can be replaced with a resistor of high value, depending on the way of detection. The ammeter and the voltmeter may be constituted of transistors, operational amplifier, resistor, and condenser, in combination thereof, and can be used in the fast operation. The detecting unit is not limited to those four kinds, but the current or the direct or integral value of electric charges may be detected, wherein a plurality of photoelectric conversion units may be configured to output at the same time or in sequence by a combination of the detector for detecting the current or voltage value, resistor, condenser, and switching element. When creating a line sensor or an area sensor, the potentials of 1,000 or more photoelectric conversion units are controlled and detected by combining them with the wirings of the power supply unit or the switch element. In this case, it is beneficial in respect of the SN ratio and the cost that part of the switch element, condenser and resistor is made on the same substrate as the photoelectric conversion substrate. In this case, the photoelectric conversion unit of this example, which has the same layer configuration from the lower electrode layer to the i-layer as that of TFT which is a typical switch element, can be formed simultaneously through the simple process, to realize a photoelectric conversion device having lower cost and high SN ratio.

EXAMPLE 2

Figure 9:
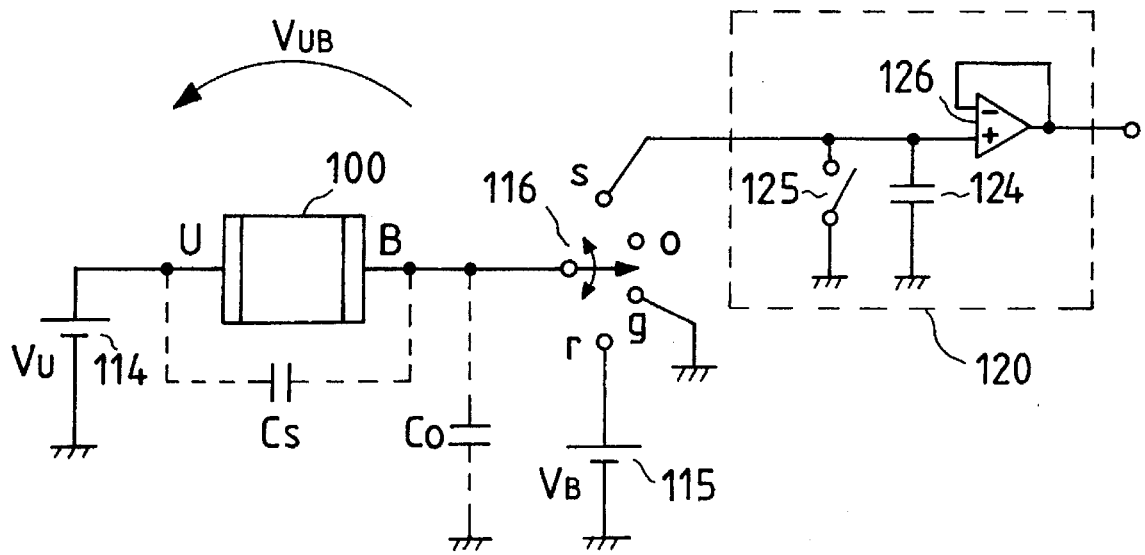

FIG. 9 is an overall circuit diagram showing a second example of a photoelectric conversion device according to the present invention. The like numerals are attached to like parts through this figure and FIG. 4B. The layer configuration of photoelectric conversion unit 100 is the same as that of FIG. 4A. In FIG. 9, 114 is a power source $V_U$ for supplying a positive potential to U electrode, 115 is a power source $V_B$ for supplying a predetermined potential to B electrode in the refresh mode of photoelectric conversion unit, and 116 is a switch element for switching between each mode. At this time, the power source 115 is set to a voltage equal to or lower than that of the power source 114.

In this example, four modes are specifically provided, including (1) photoelectric conversion unit refresh mode, (2) B electrode initialization mode, (3) storage mode, and (4) detection mode.

The electric field is applied to each layer of the photoelectric conversion unit 100, for the photoelectric conversion unit refresh mode (1), in the same direction as the refresh mode of the first example, and for the B electrode initialization mode, storage mode and detection mode (2), (3) and (4), in the same direction as the photoelectric conversion mode of the first example, in which the operation of photoelectric conversion unit 100 is fundamentally identical. Each mode will be described below in sequence.

In the photoelectric conversion unit refresh mode (1), the switch element 116 is connected to position r in the figure, so that a potential $V_B$ from the power source 115 is applied to B electrode. A positive potential $V_U$ from the power source 114 is applied to U electrode, namely, the potential $V_{UB}$ of U electrode relative to that of B electrode is equal to ($V_U$–$V_B$). Thus, electrons and holes within the photoelectric conversion unit 100 disappear, to refresh.

Then, the switch element 116 is connected to position g to effect the B electrode initialization mode (2), so that the GND potential is supplied to B electrode. At this time, $V_{UB}$ becomes a positive voltage, and after a rush current flows through the photoelectric conversion unit 100, the operation transfers to the photoelectric conversion mode.

Then, the switch element 116 is connected to position o for the storage mode (3), so that B electrode is open for direct current. However, the potential can be held by the equivalent capacitive component Cs or floating capacity Co of photoelectric conversion unit 100 as indicated by the dotted line.

Herein, if a light is incident upon the photoelectric conversion unit 100, corresponding current flows out of the B electrode, so that the potential of B electrode rises. That is, light incident information is stored in Cs or Co as the electric charge. If the switch element 116 is connected to position s after a certain period of storage time, the operation transfers to the detection mode (4). At this time, the electric charges stored in Cs or Co flow to the detection unit 120 simultaneously, but this amount of electric charge corresponds to the integral value of current flowing out of the photoelectric conversion unit 100 in the storage mode, or can be detected as the total amount of incident light by the detecting unit 120.

Further, the switch element 116 is connected to position r again, and then the operation is repeated. In this example, the integral value of current flowing for a certain long period of storage time can be obtained in a short time in the detection mode by a simple combination of elements, which indicates that a photoelectric conversion device of high SN ratio having a plurality of photoelectric conversion units can be fabricated at lower cost.

The operation of photoelectric conversion unit in this example is fundamentally the same as in the first example, with the exception that the potential of B electrode rises, and $V_{UB}$ drops in the photoelectric conversion mode. This indicates that the state as shown in FIG. 5C tends to occur with less amount of incident light, possibly resulting in limited amount of incident light in the normal operation, but which can be easily improved by positively inserting a large storage condenser in parallel with the floating capacity Co. Also, the detecting unit is composed of a condenser 124, a switch element 125, and an operational amplifier 126, such that the electric charge flowing in the detection mode is stored in the condenser 124 and converted to the voltage to be output via a buffer amplifier, whereby B electrode does not reach the full GND potential in the detection mode, but has no effect on the basis operation. Note that the condenser 124 is initialized by the switch element 125 in other modes than the detection mode. Also, the switching element 116 is not necessary to be multipolar, but may be comprised of a plurality of switch elements such as TFTs.

EXAMPLE 3

Figure 10:
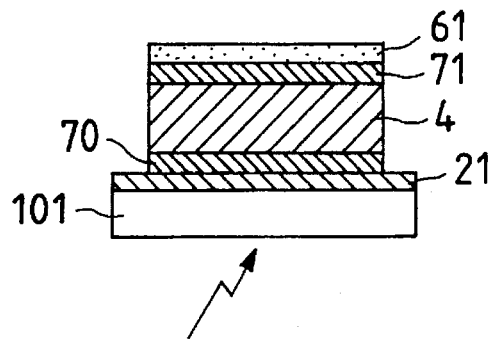

FIG. 10 is a typical layer configuration view for explaining another preferred example of a photoelectric conversion unit 100. Note that like numerals are attached to like parts throughout this figure and FIG. 4A. In FIG. 10, 101 is a transparent insulating substrate, and 21 is a lower transparent electrode layer using a transparent conductive layer. 61 is an upper electrode layer, which is necessarily not transparent, but may be a metal such as Al. Incident light passes through the transparent insulating substrate 101, the transparent electrode layer 21, and the insulating layer 70 to enter the i-layer 4.

It goes without saying that the same driving method as above described is applicable to this example.

EXAMPLE 4

An example 4 will be described below in which TFT is formed adjacent to the photoelectric conversion unit with reference to the drawings.

Figure 11A:
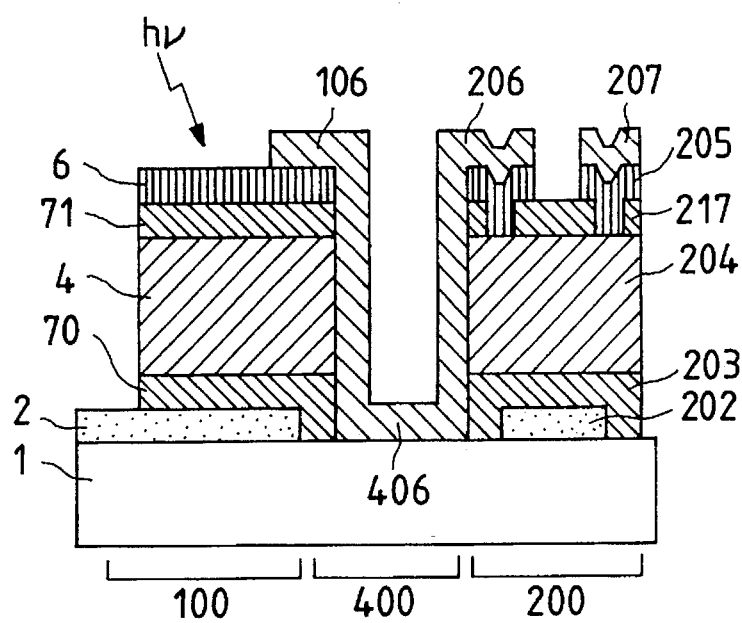
FIG. 11A is a typical cross-sectional view for explaining one preferred example of the photoelectric conversion device of the present invention.
Figure 11B:
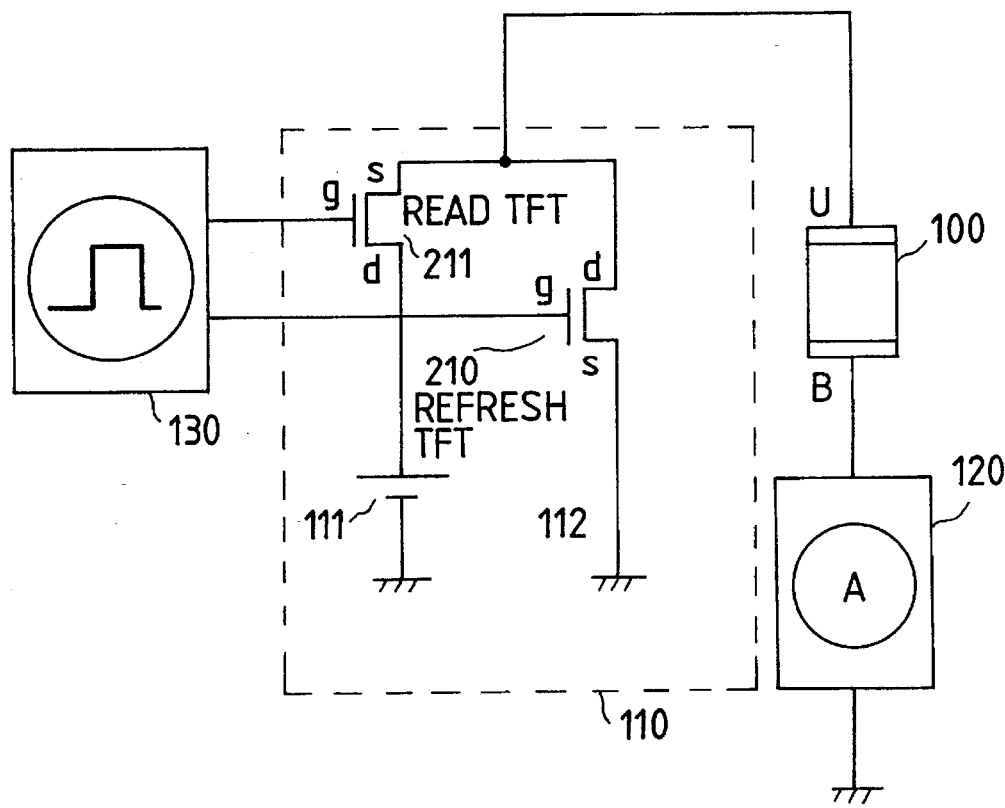
FIG. 11B and FIG. 12 each are one preferred schematic circuit diagram thereof.

FIG. 11A is a typical layer configuration view for explaining a photoelectric conversion element 100 (photoelectric conversion unit), TFT 200 (switching portion) and a wiring layer 400 within a photoelectric conversion device according to a fourth example of the present invention, and FIG. 11B is a schematic circuit diagram of the photoelectric conversion device. In FIG. 11A, 2 is an insulating substrate made of glass, and 2 is a lower electrode formed of Al or Cr. 70 and 71 are lower and upper insulating layers made of an insulating material such as silicon nitride (SIN) for blocking the passage of electrons and holes, respectively, its thickness being set to 500 Å or greater through which electrons and holes can not move due to tunnel effect. 4 is a photoelectric conversion semiconductor layer such as an intrinsic semiconductor i-layer made of amorphous silicon hydride (a-Si), and 6 and 106 are upper electrodes, in which 6 is a transparent electrode portion formed of n-layer made of a-Si, and 106 is an opaque electrode portion made of Al or Cr.

In this example, the lower electrode 2 and the upper electrode 106 are formed of opaque electrode, the upper electrode being formed of two layers in which the opaque electrode portion 106 can cover insufficiently the transparent electrode portion 6 to allow the incidence of light, but the upper electrode may be formed of only a transparent electrode such as ITO, and if the lower electrode is formed of transparent electrode, the opaque electrode portion 106 of upper electrode may cover the transparent electrode portion 6, or the opaque electrode portion 106 may cover the entire surface without providing the transparent electrode portion 6.

202 is a gate electrode made of Al or Cr, 203 is a gate insulating layer made of silicon nitride SiN, 204 is a semiconductor layer formed of an intrinsic semiconductor i-layer made of amorphous silicon hydride a-Si, 205 is an ohmic contact layer formed of n-layer or n⁺-layer of a-Si for permitting movement of electrons between the semiconductor layer 204 and a source electrode 206 and a drain electrode 207, and 217 is a protective layer covering the surface of the semiconductor layer 204 formed of silicon nitride SiN, the protective layer 217 being provided with a contact hole for the connection between the semiconductor layer 204 and the n-layer 205. The source electrode 206 and the drain electrode 207 are formed of Al or Cr.

Also, the upper electrode 106 of photoelectric conversion element 100 and the source electrode 206 of TFT 200 are connected via a wiring 406 made of Al or Cr. As will be clear from the figure, the layer configuration of each element is the same, whereby it is possible to form the films of the same material on the same insulating substrate 1 at the same time. Also, the wiring layer can be also formed simultaneously with the electrode of each element.

In FIG. 11B, 100 is a symbol of photoelectric conversion element as shown in FIG. 11A, U indicating an electrode on the side of upper electrode 106 and B indicating an electrode on the side of lower electrode 2. 120 is a detecting unit, and 110 is a power supply unit, which is composed of a positive power supply 111 for supplying a positive potential to U electrode, and a connection 112 for supplying a GND potential which is the same potential as B electrode.

In the figure, 210 and 211 are a symbol of TFT as shown in FIG. 11A, g, s and d indicating gate electrode 202, source electrode 206 and drain electrode 207, respectively.

In FIG. 11A, only one TFT 200 is represented, but in practice, TFT 210 and TFT 211 as shown in FIG. 11B are both formed on the same insulating substrate. Respective gate electrodes are connected to a control unit 130, which controls the refresh-TFT 210 to turn on the refresh mode, or the read-TFT 211 to turn on in the photoelectric conversion mode.

It should be noted that the fundamental operation principle of photoelectric conversion unit is the same as in the example 1, and is not described herein.

Herein, the operation of the detecting unit 120 in this example will be described using FIGS. 11A, 11B, 5A to 5C and 6. FIG. 6 is a timing chart of operation in the photoelectric conversion device of FIGS. 11A and 11B. In FIG. 6, $V_{UB}$ is a potential at the U electrode with respect to the B electrode of the photoelectric conversion element 100, and P shows the state of light incidence, ON indicating the light incident state, and OFF indicating no incident illumination or dark state. $I_s$ shows the current flowing into the detecting unit 120, indicating the elapse of time in a transversal direction. At first, from the state where refresh-TFT 210 and read-TFT 211 are both in the off state, if refresh-TFT 210 is turned on by the control unit 130, the refresh mode is entered, $V_{UB}$ becomes 0V which is a GND potential, electrons and holes diffuse within the i-layer 4, and at the same time recombine, as shown in FIG. 5A, so that a negative rush current as indicated E in FIG. 6 flows through the detecting unit 120 as electric charges move. Thereafter, the refresh mode is ended, and if the read-TFT 211 is turned on under control at the same time when the refresh-TFT 210 is turned off, $V_{UB}$ becomes a positive voltage, so that a positive rush current E' charging an equivalent capacity within the photoelectric conversion element flows to enter the photoelectric conversion mode. At this time, if a light is incident, a light current indicated by A flows. If the similar operation is in the dark state, no current indicated by A' flows. Hence, if the light current A is integrated directly or over a certain period of time, the incidence of light can be detected. Also, if the refresh-TFT 210 is turned on under control at the same time when the read-TFT 211 is turned off, a rush current B flows. This is reflected to the total amount of incident light in a period of photoelectric conversion mode immediately before, and by integrating or equivalently evaluating this rush current B, the incidence of light can be detected. If there is no incident illumination in the photoelectric conversion mode immediately before, the rush current is reduced as indicated by B', and the detection of its difference will allow for detection of incident light. Also, since the rush current E or E' is almost equal to the rush current B', this may be subtracted from the rush current B.

Also, even in the same period of photoelectric conversion mode, if the state of light incidence changes, $I_s$ will change as indicated by C, C'. By detecting this change, the light incident state can be also detected. That is, it is indicated that the refresh mode is not necessarily enabled every time of detection.

However, for some reasons, in the cases where the period of photoelectric conversion mode is extended, or the illuminance of incident light is too intense, no current may flow, in spite of the incident illumination as indicated by D, in this example. This is because a great number of electrons and holes remain within the i-layer 4, and the electric field within the i-layer 4 is reduced, owing to such electrons and holes, so that produced electrons are not led to the interface between the i-layer 4 and the upper insulating layer 71, and recombine with holes within the i-layer 4, as shown in FIG. 5C. In this state, if the state of light incidence is changed, current may flow unstably, but by turning back to the refresh mode, electrons and holes within the i-layer 4 will extinguish, and then in the photoelectric conversion mode, current such as A' corresponding to incident light like A can be obtained.

In the above description, the incident light was constant, but the currents of A, B, and C all change continuously, in accordance with the intensity of incident light, in this example, and it is needless to say that not only the detection of whether or not there is incident illumination, but also the quantitative detection of intensity can be made.

Also, in the above description, in extinguishing electrons and holes within the i-layer 4 in the refresh mode, it is ideal that all electrons and holes are extinguished, but extinguishing electrons and holes only partly can take effect with the same results as when extinguishing all as in A or C for the light current, and without causing any problem. Also, if electrons and holes are extinguished with a fixed amount of electrons and holes left, the light quantity can be also quantitatively detected by the current of B.

That is, at the time of detection in the next photoelectric conversion mode, it is necessary that the current value is not in the state D, i.e., the state as shown in FIG. 5C, and it is only necessary that the voltage $V_{UB}$ in the refresh mode, and the period of refresh mode, may be appropriately determined. Also, it should be noted that in the refresh mode, the voltage $V_{UB}$ is not limited to 0V. When a number of electrons and holes remain in the i-layer 4, the electric field within the i-layer is applied in a direction of leading holes to the U electrode side or electrons to the B electrode side, even if $V_{UB}$ is at positive voltage, so that electrons and holes are distributed into the i-layer 4, and can be extinguished. Also, by appropriately setting $V_{UB}$ at a negative voltage, the electric field is applied in a direction of promoting distribution of electrons and holes into the i-layer 4, so that the higher extinction rate of electrons and holes can be attained.

These points will be more apparent from FIGS. 7A and 7B and its description.

Also, the detecting unit as shown in FIGS. 8A to 8D, and other detecting units, can be applied in this example.

The photoelectric conversion element of this example has the same layer configuration from the lower electrode layer to the i-layer as that of TFT which is a typical switch element as above described. Accordingly, it is possible to form each layer of the photoelectric conversion unit and the switch portion simultaneously to produce a reliable photoelectric conversion device with lower cost and high SN ratio.

EXAMPLE 5

Figure 12:
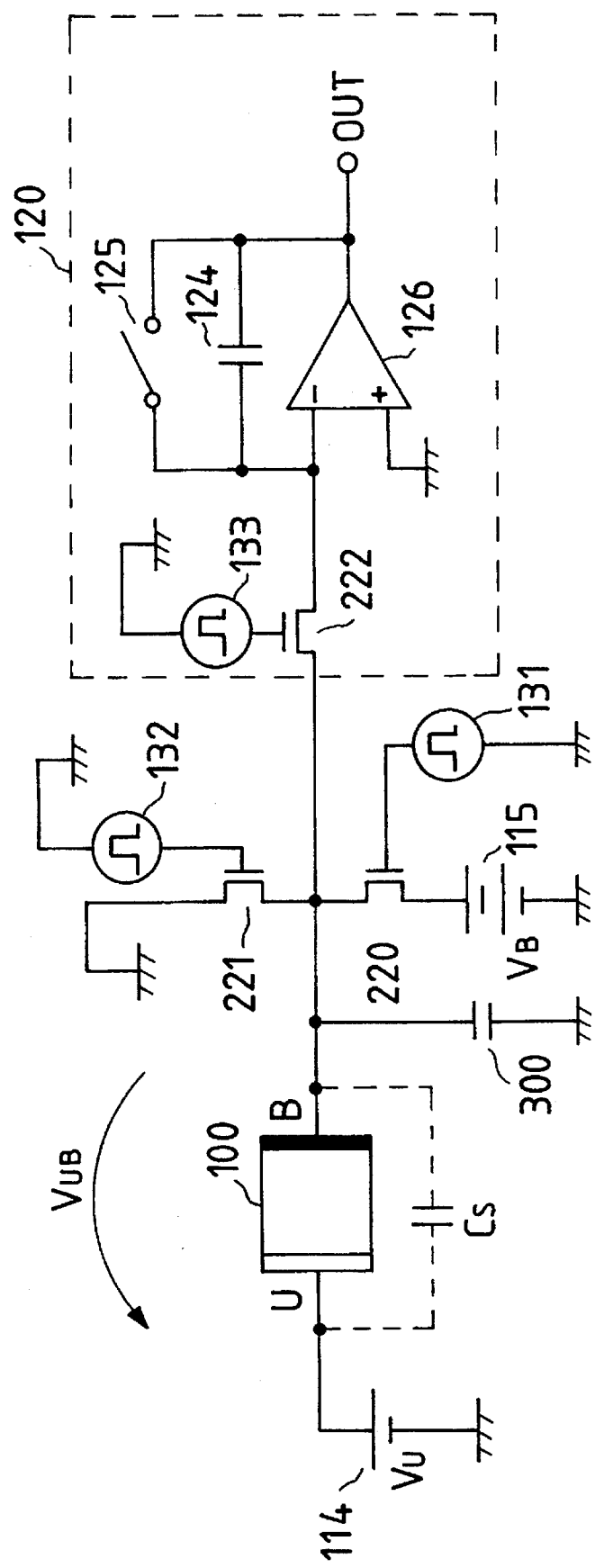

FIG. 12 is a circuit diagram showing a fifth example of a photoelectric conversion device of the present invention. Note that like numerals are attached to like parts throughout this figure and FIG. 11B. The layer configuration of a photoelectric conversion element 100 and TFTs 220 to 222 is the same as that of FIG. 11A.

As shown in FIG. 12, in this example, a condenser 300 which is a capacitive element is connected between B electrode of photoelectric conversion element 100 and GND potential, and 114 is a power source $V_U$ for supplying a positive potential to U electrode, and 115 is a power source $V_B$ for supplying a predetermined potential to B electrode in the fresh mode of photoelectric conversion element. Herein, a power source 115 is set to a voltage equal to or lower than that of power source 114. The gate electrode of each of TFTs 220 to 222 is controlled to turn on or off by control units 131 to 133, respectively. The portion surrounded by the broken line is a detecting unit for detecting light being incident upon the photoelectric conversion element 100, as described below.

In this example, four modes are specifically provided, including (1) photoelectric conversion element refresh mode, (2) B electrode initialization mode, (3) storage mode, and (4) detection mode. The photoelectric conversion element refresh mode (1) corresponds to the refresh mode of the first example, and the B electrode initialization mode (2), the storage mode (3) and the detection mode (4) correspond to the photoelectric conversion mode of the first example, in which an electric field is applied in the same direction to each layer of the photoelectric conversion element 100, and the operation of the photoelectric conversion element 100 is fundamentally identical. Each of the modes will be described in sequence below. After three TFTs 220 to 222 are turned off, TFT 220 is turned on by a control unit 131 in the photoelectric conversion element refresh mode (1), so that potential $V_B$ is applied to B electrode by the power source 115. A positive potential $V_U$ is applied to U electrode by the power source 114, namely, the potential $V_{UB}$ of U electrode relative to that of B electrode is equal to $(V_U-V_B)$. Then, electrons and holes within the photoelectric conversion element 100 disappear to refresh. Then, after TFT 220 is turned off, TFT 221 is turned on by a control unit 132, to enable the B electrode initialization mode (2), so that B electrode is supplied with GND potential. At this time, $V_{UB}$ becomes a positive voltage, and after a rush current flows, the photoelectric conversion unit 100 transfers to the photoelectric conversion mode. Then, TFT 221 is turned off, so that B electrode is open for direct current. However, the potential can be held by the condenser 300. Herein, if light is incident upon the photoelectric conversion element 100, corresponding current flows out of the B electrode, so that the potential of B electrode rises. That is, light incident information is stored as the electric charge in the condenser 300. If TFT 222 is turned on by the control unit 133 after a certain period of storage time, the operation transfers to the detection mode (4). At this time, the electric charges stored in the condenser 300 flow through TFT 222 to an operational amplifier 126, but this amount of electric charge corresponds to the integral value of current flowing out of the photoelectric conversion element 100 in the storage mode, or can be detected as the total amount of incident light by an integrator composed of operational amplifier 126, condenser 124 and switch element 125. This integrator turns on the switch element 125 by the control unit, not shown, prior to transferring to the detection mode (4), to discharge the condenser 124 for the initialization. Further, after TFT 222 is turned off, TFT 220 is turned on again, and then the operation is repeated.

A feature of this example as above described is that the integral value of current flowing for a certain long period of storage time can be obtained in a short time of the detection mode by a simple combination of elements, which indicates that a photoelectric conversion device of high SN ratio having a plurality of photoelectric conversion elements, and less load of operational amplifier which is highly expensive, can be fabricated at lower cost. The operation of photoelectric conversion element in this example is fundamentally the same as in the first example, with the exception that the potential of B electrode rises, and $V_{UB}$ drops in the photoelectric conversion mode. This indicates that the state as shown in FIG. 5C tends to occur with less amount of incident light, possibly resulting in limited amount of incident light in the normal operation, but which can be easily improved by sufficiently increasing the condenser 300. Conversely, if the detection is satisfactory with small quantity of light, the floating capacity Cs provided in the photoelectric conversion element 100 as indicated by the dotted line acts as a capacitive element and is operable, without placing the condenser 300 as a positive element. This floating capacity Cs can be regulated by the area of opaque electrode 106 of upper electrode for the photoelectric conversion element 100, as shown in FIG. 11A.

Figure 13A:
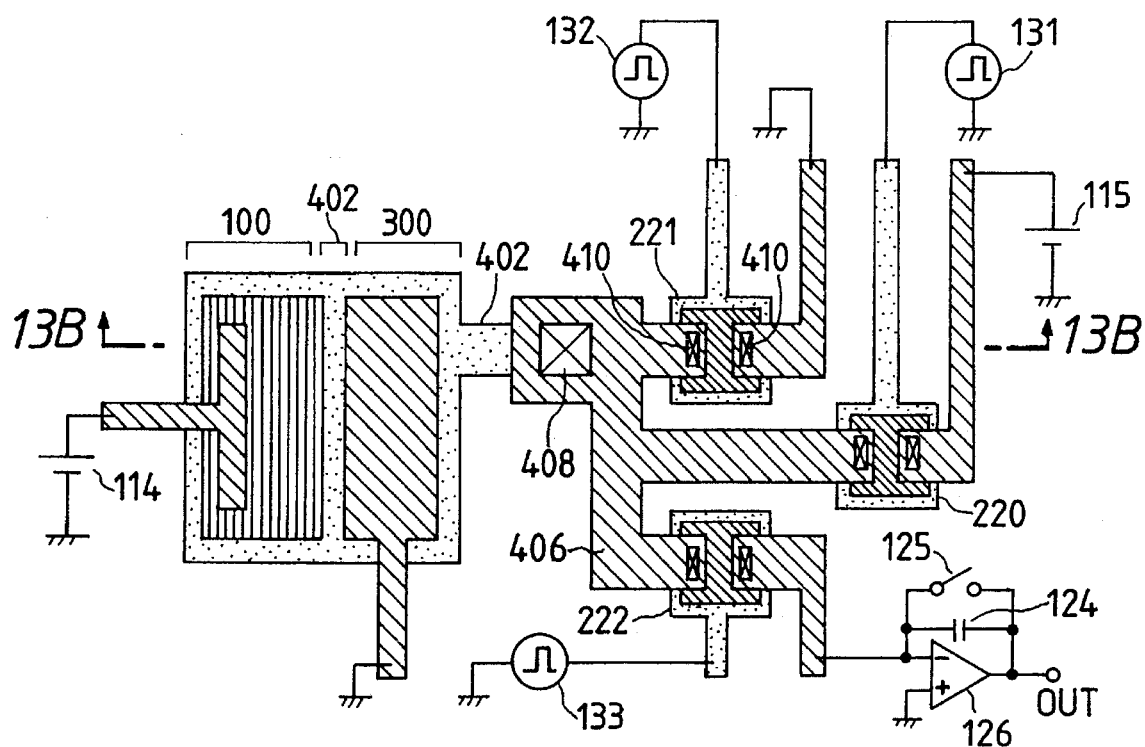
FIG. 13A is a typical plan view for explaining the photoelectric conversion device of the present invention.
Figure 13B:
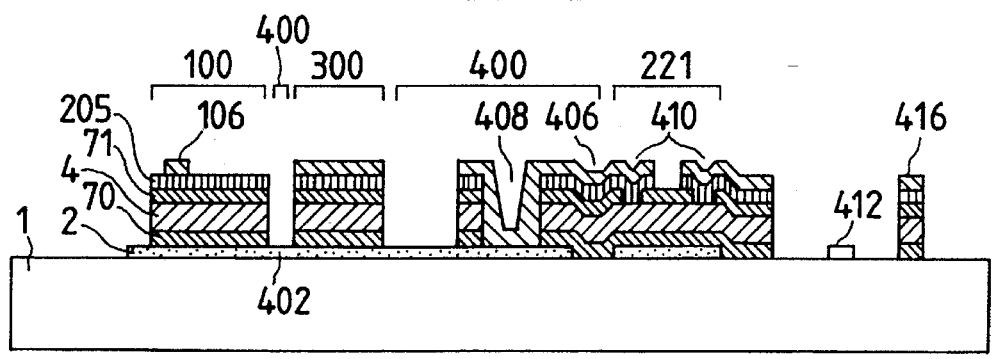
FIG. 13B is a typical cross-sectional view thereof.

FIG. 13A is a typical plan view of photoelectric conversion device as shown in FIG. 12, and FIG. 13B is a typical cross-sectional view thereof taken along the line 13B—13B as illustrated in the typical plan view of FIG. 13A. In FIG. 13A, the parts which can not particularly illustrated are indicated by the same symbols as in FIG. 12. 100 is a photoelectric conversion element, and 220 to 222 are TFTs, in which the connection of a semiconductor layer with a main electrode via an ohmic contact layer is made via a contact hole 410 formed in a protective layer. 300 is a condenser, and 402 and 406 are wirings for electrical connection of each element, via the contact hole. In FIG. 13B, 412 and 416 are wirings for the connection with other components.

Note that the photoelectric conversion element 100 and TFTs 220 to 222 are of the same layer configuration as in FIG. 11A of the fourth example. The layer configuration of the condenser 300 as used in this example is illustrated in FIG. 13C.

Figure 13C:
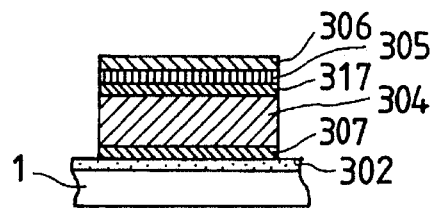
FIG. 13C is a typical cross-sectional view for explaining one exemplary configuration of a condenser.

In the condenser 300 as used in this example, 302 is a lower electrode of condenser made of Al or Cr, 307 is a lower insulating layer formed of silicon nitride SiN, 304 is a semiconductor layer formed of an intrinsic semiconductor i-layer of amorphous silicon hydride a-Si, 317 is an upper insulating layer formed of silicon nitride SiN, 305 and 306 are upper electrode layers, in which 305 is a transparent electrode portion formed of n-layer of a-Si and 306 is an opaque electrode portion formed of Al or Cr, as shown in FIG. 13C. Herein, the lower insulating layer 307, semiconductor layer 304 and upper insulating layer 317 act as the intermediate layer of the condenser 300, and owing to containment of upper and lower insulating layers 317, 307, an excellent condenser with less leak is formed. Also, the lower electrode 2 of the photoelectric conversion element 100 and the lower electrode 302 of condenser are connected via the wiring 402 made of Al or Cr, as shown in FIG. 13A and FIG. 13B.

As will be clear from FIG. 13C and FIG. 11A, the layer configuration for each element used in this example is identical, in which the film can be formed of the same material on the same insulating substrate 1 at the same time, and the wiring layer can be formed at the same time with the electrode of each element, and composed of common film.

Referring now to FIGS. 13A and 13B, the forming method of each element in this example will be described below.

First, Cr is deposited about 500 Å thick as the lower metal layer 2 on the glass substrate 1 which is made of an insulating material, by sputtering, and then, patterning is made by photolithography, to etch away unnecessary area. Thereby, the lower electrode of photoelectric conversion element 100, the gate electrode of TFTs 220 to 222, the lower electrode of condenser 300, and the lower electrodes 402, 412 are formed.

Then, SiN (70), i (4) and SiN (71) layers are deposited about 2000, 5000 and 2000 Å thick, respectively, within the same vacuum by CVD. Each layer of these becomes the lower insulating layer/photoelectric conversion semiconductor layer/upper insulating layer of the photoelectric conversion element 100, the gate insulating film/semiconductor layer/protective layer of TFTs 220 to 222, and the intermediate layer of condenser 300. Also, they are used as the insulating layers at the cross section of upper and lower wirings. The thickness of each layer is not limited thereto, and should be optimally designed in accordance with the voltage, current, charge, incident light quantity, etc., but for at least SiN, is thick enough not to permit the passage f electrons and holes therethrough, and is desirably 500 Å or more to be able to function as the gate insulating film of TFT.

After deposition of each layer, an area which becomes a contact hole 410 of SiN 71 is etched, n-layer 205 is then deposited 500 Å thick by CVD, subsequently, n-layer 205 on unnecessary portion is patterned by photolithography, and etched away, and further SiN (70)/i (4)/SIN (71) of an area which becomes a contact hole 408 is etched away. Thereby, a transparent electrode portion above the photoelectric conversion element 100, ohmic contact layer of TFTs 200 to 222, intermediate layer of condenser 300, transparent electrode portion of upper electrode, and contact hole 408 are formed, and the semiconductor layer of TFTs 220 to 222 and the ohmic contact layer are connected via the contact hole 410.

Then, an upper metal layer 106 is deposited about 10,000 Å thick by sputtering. Further, the upper metal layer 106 is patterned by photolithography to each unnecessary area, opaque electrode portion of upper electrode of the photoelectric conversion element 100, source electrode and drain electrode which are main electrodes of TFTs 220 to 222, opaque electrode portion which is an upper electrode of the condenser 300, and upper wirings 406, 416 are formed. At the same time, through the contact hole 408, the lower wiring 402 and the upper wiring 406 are connected.

Further, unnecessary SiN (71)/i (4)/SiN (71) layers are etched for the separation of each element. This completes the formation of photoelectric conversion element 100, TFTs 220 to 222, lower wirings 402, 412, upper wirings 406, 416, and contact holes 408, 410. Also, the top portion of each element is normally covered with a passivation film such as SiN, though not shown, to provide better durability.

As above described, in this example, photoelectric conversion element 100, TFTs 220 to 222, condenser 300, and wiring 400 can be formed only by etching the lower metal layer 2, SiN (70)/i (4)/SiN (71) layers, n-layer 205, upper metal layer 106, which are deposited at the same time and commonly used, as well as each layer. Also, no injection blocking layer is provided within the photoelectric conversion element 100, and can be formed within the same vacuum. Further, the gate insulating film/i-layer interface which is important on the characteristics of TFT can be formed within the same vacuum, and TFT of this example allows formation of each of the elements and wirings by forming the protective layer of SiN 71 which is the same material and has the same film thickness as the upper insulating layer of photoelectric conversion element which is formed within the same vacuum as the gate insulating film and the semiconductor layer, without exposing the semiconductor surface corresponding to the channel of TFT, and is always obtained with stable characteristics, without being affected by various damages or contamination midway during the process.

Furthermore, since the intermediate layer of condenser 300 contains an insulating layer with less leak caused by the heat, the condenser having better characteristics can be obtained. In this way, this example allows the production of photoelectric conversion device having high performance at lower cost.

As will be clear from the above description, the photoelectric conversion element is not limited to those as shown in the above examples. That is, a first electrode layer, a first insulating layer for blocking the movement of holes and electrons, a photoelectric conversion semiconductor layer, a second insulating layer for blocking the movement of holes and electrons, and a second electrode layer are only necessary. Further, the photoelectric conversion semiconductor is only necessary to have a photoelectric conversion function of producing electron-hole pairs under illumination. The layer configuration is not of one layer, but may be of multi layers, or have the continuously changing characteristics.

Similarly, with the TFT, it is only necessary to have a gate electrode, a gate insulating film, a semiconductor layer capable of forming channels, an ohmic contact layer and the main electrodes. For example, the protective layer covering the semiconductor surface may not be provided, or the ohmic contact layer may be p-layer, in which the control voltage of gate electrode is reversed to utilize the holes as the channel.

Also, similarly, with the condenser, it is only necessary to have a lower electrode, an intermediate layer contacting upper or lower insulating layer, and an upper electrode. For example, the transparent electrode portion of upper electrode, upper insulating layer and semiconductor layer are not provided, but the upper electrode (opaque electrode portion), lower insulating layer, and lower electrode may be only provided, or may be shared with the electrode for each element without specific isolation from the photoelectric conversion element and TFT.

Further, the insulating substrate is not necessarily all made of an insulating material, and may be composed of the insulating material deposited on the conductor or semiconductor.

It should be noted that the present invention is not limited to the above description, and variations or combinations may be appropriately made within the scope or spirit of the present invention.

As above described, the photoelectric conversion element of the present invention makes it possible to provide a photoelectric conversion device which is capable of detecting the amount of incident light without providing the injection blocking layer, and allows for easy optimization of the process, better yield, and reduced manufacturing cost, with high SN ratio and lower cost.

Also, because of making no use of tunnel effect or Schottky barrier from the first electrode layer or the second electrode layer to the photoelectric conversion semiconductor layer, the electrode material can be chosen at will, with high degree of freedom in regulating the thickness of insulating layer or others, and the good matching with the elements which must be formed at the same time, and in particular, since the same film configuration from the lower electrode layer which is a gate electrode to the semiconductor layer can be taken as that of the field effect transistor (TFT), each layer can be formed at the same time, resulting in the photoelectric conversion device with higher SN ratio and lower cost.

Also, because light information is stored as the carrier in the photoelectric conversion portion itself, while at the same time having the property of flowing current in real time, a photoelectric conversion device with simple configuration and having complex functions can be provided.

What is claimed is:

1. A photoelectric conversion device comprising:
    a photoelectric conversion unit having, in lamination, a first electrode layer, a first insulating layer for blocking carriers of first conduction type and carriers of second conduction type different from said first conduction type from passing therethrough, a photoelectric conversion semiconductor layer, a second insulating layer for blocking carriers of said first conduction type and carriers of said second conduction type from passing therethrough, and a second electrode layer;
    a power source unit for supplying, in a refresh mode, a potential between said first electrode layer and said second electrode layer, or making the same potential at said first electrode layer and said second electrode layer, to promote recombination of carriers of said first conduction type and carriers of said second conduction type within said photoelectric conversion semiconductor layer, or in a photoelectric conversion mode, supplying a potential between said first electrode layer and said second electrode layer to lead carriers of said first and second conduction types produced by the light incident upon said photoelectric conversion semiconductor layer to an interface between said second insulating layer and said photoelectric conversion semiconductor layer, and an interface between said first insulating layer and said photoelectric conversion semiconductor layer, respectively; and
    a detecting unit for detecting carriers of said second conduction type led to the interface between said first insulating layer and said photoelectric conversion semiconductor layer, or carriers of said first conduction type led to the interface between said second insulating layer and said photoelectric conversion semiconductor layer.

2. A photoelectric conversion device according to claim 1, wherein at least one of said first and second electrode layers is a transparent conductive layer.

3. A photoelectric conversion device according to claim 1, wherein at least part of said photoelectric conversion semiconductor layers is amorphous silicon having hydrogen.

4. A photoelectric conversion device comprising:
    a first electrode layer;
    a first insulating layer provided on said first electrode layer for blocking carriers of first conduction type and carriers of second conduction type different from said first conduction type from passing therethrough;
    a photoelectric conversion semiconductor layer provided on said first insulating layer;
    a second insulating layer provided on said photoelectric conversion semiconductor layer for blocking carriers of said first conduction type and carriers of said second conduction type different from said first conduction type from passing therethrough; and
    a second electrode layer provided on said second insulating layer;
    wherein at least said second electrode layer and said photoelectric conversion semiconductor layer are of the same shape.

5. A photoelectric conversion device according to claim 4, wherein said first or second electrode layers is a transparent conductive layer.

6. A photoelectric conversion device according to claim 4, wherein said photoelectric conversion semiconductor layers has amorphous silicon containing hydrogen.

7. A photoelectric conversion device comprising:
    a first electrode layer;
    a first insulating layer provided on said first electrode layer for blocking carriers of first conduction type and carriers of second conduction type different from said first conduction type from passing therethrough;

a photoelectric conversion semiconductor layer provided on said first insulating layer;

a second insulating layer provided on said photoelectric conversion semiconductor layer for blocking carriers of said first conduction type and carriers of said second conduction type different from said first conduction type from passing therethrough; and a second electrode layer provided on said second insulating layer for providing a potential with respect to said first electrode layer.

8. A photoelectric conversion device according to claim 7, wherein said first or second electrode layers is a transparent conductive layer.

9. A photoelectric conversion device according to claim 7, wherein said photoelectric conversion semiconductor layer has amorphous silicon containing hydrogen.

10. A photoelectric conversion device comprising:

a photoelectric conversion unit having laminated, on a substrate, a first electrode layer, a first insulating layer for blocking carriers of first conduction type and carriers of second conduction type different from said first conduction type from passing therethrough, a photoelectric conversion semiconductor layer, a second insulating layer for blocking carriers of said first conduction type and carriers of said second conduction type from passing therethrough, and a second electrode layer;

a switch unit having laminated a gate electrode layer, a third insulating layer, a semiconductor layer, a pair of first and second main electrode layers separated by a portion which is a channel region of this semiconductor layer, and an ohmic contact layer between these main electrode layers and said semiconductor layer;

wherein said first or second electrode layers of said photoelectric conversion unit and a first main electrode layer of said switch unit are electrically connected.

11. A photoelectric conversion device according to claim 10, further comprising a power source unit for supplying, in a refresh mode, a potential between said first electrode layer and said second electrode layer of said photoelectric conversion element, or making the same potential at said first electrode layer and said second electrode layer, to promote recombination of carriers of said first conduction type and carriers of said second conduction type within said photoelectric conversion semiconductor layer, or in a photoelectric conversion mode, supplying a potential between said first electrode layer and said second electrode layer of said photoelectric conversion element to lead carriers of said first and second conduction types produced by the light incident upon said photoelectric conversion semiconductor layer to an interface between said second insulating layer and said photoelectric conversion semiconductor layer, and an interface between said first insulating layer and said photoelectric conversion semiconductor layer, respectively, and a circuit for switching on or off said switch unit for detecting carriers of said second conduction type led to the interface between said first insulating layer and said photoelectric conversion semiconductor layer, or carriers of said first conduction type led to the interface between said second insulating layer and said photoelectric conversion semiconductor layer.

12. A photoelectric conversion device according to claim 10, wherein for said photoelectric conversion element and said switch element, said first electrode layer and said gate electrode layer, said first insulating layer and said third insulating layer, said photoelectric conversion semiconductor layer and said semiconductor layer, and said second electrode layer and said first or second main electrode layer are composed of common films, respectively.

13. A photoelectric conversion device according to claim 10, wherein on said substrate, a capacitive element comprising a third electrode layer, a fourth electrode layer, an intermediate layer between said third electrode layer and said fourth electrode layer and having at least a fourth insulating layer, wherein said first and second electrode layer of said photoelectric conversion element and said third or fourth electrode layer of said capacitive element are electrically connected.

14. A photoelectric conversion device according to claim 13, wherein for said photoelectric conversion element and said capacitive element, said first electrode layer and said third electrode layer, said second electrode layer and said fourth electrode layer, and said first or second insulating layer and said fourth insulating layer are composed of common films, respectively.

15. A photoelectric conversion device according to claim 10, wherein at least part of said photoelectric conversion semiconductor layer and said semiconductor layer is amorphous silicon containing hydrogen.

16. A photoelectric conversion device according to claim 10, further comprising a detecting unit for detecting an integral value of carriers of said first or second conduction type produced in said photoelectric conversion mode.

* * * * *

UNITED STATES PATENT AND TRADEMARK OFFICE
CERTIFICATE OF CORRECTION

PATENT NO. : 5,591,963

DATED : January 7, 1997

INVENTORS : SHINICHI TAKEDA ET AL.

It is certified that error appears in the above-identified patent and that said Letters Patent is hereby corrected as shown below:

COLUMN 3

Line 22, "layer." should read --layer,--.

COLUMN 4

Line 41, "lacked," should read --lacking,--;
  Line 44, "is generated and increased," should read --will generate and increase,--.

COLUMN 5

Line 34, "electrode" should read --electrodes--.

COLUMN 6

Line 31, "of" should read --of the--.

COLUMN 7

Line 3,  "multi functions" should read --multi-functions--;
  Line 34, "indicating" should read --indicates--;
  Line 36, "indicating" should read --indicates--;
  Line 59, "circle" should read --circles--;
  Line 62, "circle" should read --circles--.

UNITED STATES PATENT AND TRADEMARK OFFICE
CERTIFICATE OF CORRECTION

PATENT NO. : 5,591,963

DATED : January 7, 1997

INVENTORS : SHINICHI TAKEDA ET AL.

It is certified that error appears in the above-identified patent and that said Letters Patent is hereby corrected as shown below:

COLUMN 10

Line 48, "effected" should read --affected--.

COLUMN 11

Line 29, "through" should read --throughout--.

COLUMN 13

Line 7, "2" should read --1--;
Line 60, "a symbol" should read --symbols--.

COLUMN 14

Line 2, delete "in";
Line 22, "indicated" should read --indicated by--.

COLUMN 17

Line 11, "cannot particularly illustrated" should read --are not detailed--.

COLUMN 18

Line 7, "f" should read --of--;
Line 14, "SiN(70)/i(4)/SIN(71)" should read --SiN(70)/i(4)/SiN(71)--;

UNITED STATES PATENT AND TRADEMARK OFFICE
CERTIFICATE OF CORRECTION

PATENT NO.  : 5,591,963

DATED       : January 7, 1997

INVENTORS   : SHINICHI TAKEDA ET AL.                    Page 3 of 3

It is certified that error appears in the above-identified patent and that said Letters Patent is hereby corrected as shown below:

COLUMN 18 continued

Line 33, "SiN(71)/i(4)/SiN(71)" should read --SiN(70/i(4)/SiN(71)--;

Line 45, ",as well as each layer" should read --on each layer--.

COLUMN 19

Line 10, "multi layers" should read --multi-layers--.

COLUMN 20

Line 61, "layers" should read --layer--.

Signed and Sealed this

Twenty-ninth Day of July, 1997

Attest:

BRUCE LEHMAN

*Attesting Officer*     *Commissioner of Patents and Trademarks*